United States Patent
Jing et al.

(10) Patent No.: US 11,057,120 B2
(45) Date of Patent: Jul. 6, 2021

(54) SYSTEM AND METHOD FOR OBTAINING FAR FIELD RADIATED POWER WITH MULTIPLE RADIATED POWER MEASUREMENTS IN MIDDLE FIELD RANGE

(71) Applicant: Keysight Technologies, Inc., Santa Rosa, CA (US)

(72) Inventors: Ya Jing, Beijing (CN); Hong-Wei Kong, Beijing (CN); Zhu Wen, Beijing (CN)

(73) Assignee: Keysight Technologies, Inc., Santa Rosa, CA (US)

( * ) Notice: Subject to any disclaimer, the term of this patent is extended or adjusted under 35 U.S.C. 154(b) by 92 days.

(21) Appl. No.: 16/551,244

(22) Filed: Aug. 26, 2019

(65) Prior Publication Data
US 2020/0213016 A1 Jul. 2, 2020

(51) Int. Cl.
*G01R 29/10* (2006.01)
*H04B 17/10* (2015.01)

(52) U.S. Cl.
CPC .......... *H04B 17/102* (2015.01); *G01R 29/10* (2013.01)

(58) Field of Classification Search
CPC ............ G01R 31/3025; G01R 31/2822; G01R 31/265; G01R 29/0878; G01R 29/10; H04B 17/102; H04B 17/15; H04B 17/29
USPC .................................................... 324/754.31
See application file for complete search history.

(56) References Cited

U.S. PATENT DOCUMENTS

| | | | |
|---|---|---|---|
| 5,204,685 A | 4/1993 | Franchi et al. | |
| 5,432,523 A * | 7/1995 | Simmers | G01R 29/10 342/360 |
| 9,288,696 B2 * | 3/2016 | Szini | H04B 17/00 |
| 9,985,733 B1 * | 5/2018 | Lee | H04B 17/102 |
| 10,033,473 B1 | 7/2018 | Kyrolainen et al. | |
| 10,587,350 B2 * | 3/2020 | Rodriguez-Herrera | H04B 17/12 |
| 2003/0117315 A1 | 6/2003 | Graham | |
| 2013/0027256 A1* | 1/2013 | Guo | H04W 24/06 343/703 |
| 2014/0273873 A1* | 9/2014 | Huynh | H04B 17/29 455/67.12 |
| 2018/0062971 A1 | 3/2018 | Kyosti et al. | |

OTHER PUBLICATIONS

Notice of Allowance dated Dec. 30, 2020, for U.S. Appl. No. 16/367,642, 12 pgs.

* cited by examiner

*Primary Examiner* — Christopher P McAndrew

(57) ABSTRACT

A method for testing an antenna array uses a probe antenna to measure an RF signal antenna pattern of the antenna array. The method includes measuring the RF signal antenna pattern at a first position and at a second position relative to the antenna array. The first position and the second position are located at different distances from the antenna array in a middle field of the antenna array. The middle field satisfies near field criteria for the antenna array and also satisfies far field criteria for each antenna element of the plurality of antenna elements in the antenna array. The method further includes determining, based on the first measurement and based on the second measurement, the RF signal antenna pattern at a third position relative to the antenna array located in a far field of the antenna array.

10 Claims, 11 Drawing Sheets

SYSTEM AND METHOD FOR OBTAINING FAR FIELD RADIATED POWER WITH MULTIPLE RADIATED POWER MEASUREMENTS IN MIDDLE FIELD RANGE

CROSS REFERENCE TO RELATED APPLICATIONS

The present application claims priority under 35 U.S.C. § 119(e) to Chinese Patent Application No. 201811608320.X, filed on Dec. 26, 2018. The entire disclosure of Chinese Patent Application No. 201811608320.X is hereby specifically incorporated by reference in its entirety.

BACKGROUND

Electronic communications devices may have controllable antenna arrays that radiate energy as RF signals (antenna beams) in specific antenna patterns (e.g., radiated power in specific directions). Accordingly, antenna arrays are used in electronic communications, including in the wireless telecommunications industry, for example. Antenna arrays are tested by test solutions which are used, in part, to measure the antenna patterns radiated from the antenna arrays.

Conventional test solutions formerly depended on a vector network analyzer and required a device under test (DUT) with an antenna array to have radio frequency (RF) connectors, such as coaxial connectors, in order to perform the test. However, with the evolution of wireless communications technologies, DUTs increasingly have antenna arrays that are directly connected to (i.e., integrated with) RF transceivers, such that DUTs are increasingly provided with no RF connectors. Overall performance of such a DUT presently must be tested "over-the-air," since there is no place (e.g., no RF connector) to connect a coaxial cable from the DUT and/or the antenna array to test equipment. In fact, due to antenna array integration, overall DUT performance is now typically tested as a function of the antenna array configuration. When the antenna array is designed to produce the RF signals (antenna beams), for instance, then the DUT performance must be characterized over a range of beam angles and/or widths.

Conventional test solutions for over-the-air testing are aimed primarily at single antenna measurements. However, due to recent developments such as the advent of 5G networks and the introduction of millimeter wave (mmW) bands and corresponding wireless communication standards (e.g., IEEE 802.11ad), cost, size and speed have become key attributes of test methodology. Generally, antenna pattern measurements typically take place either at an outdoor test range or in a chamber test range. Outdoor test ranges are used for antennas having a long far field (e.g., greater than 100 m), rendering use of an indoor test range or test chamber impractical. Test chambers are used for antennas having shorter far fields or for measuring near field characteristics, which are mathematically transformed to far field characteristics. The test chambers may be anechoic test chambers, which are shielded, having walls covered in absorbing material that minimizes internal reflections, typically by several tens of decibels.

In wireless communication systems, measurement metrics of an antenna pattern may be mandatory, for instance when required by standards for base stations. For example, equivalent isotropic radiated power (EIRP) testing in 3GPP Technical Specification 38.104 requires measuring radiated power for each beam direction of the antenna array. This requirement is also driven by wireless operators for network construction and optimization. According to conventional test solutions, the antenna pattern of a device can be measured in three ways. First, the radiated power may be measured directly in the far field. Second, a three-dimensional (complex) antenna pattern measurement may be performed including amplitude and phase information in the near field, and each measurement in the near field is mathematically transformed to the far field using a complex mathematical solution. The first and second methods each have corresponding disadvantages. For example, to support 5G technology, base stations adopting massive multiple-input and multiple-output (MIMO) technologies have large antenna arrays, which present challenges to setting up an actual far field test environment according to the first method. As one example, the far field test distance is larger than 11 meters for a 32×32 antenna array with half wavelength or half lambda ($\lambda$) antenna spacing of 28 GHz. It may be expensive and time consuming to set up such a large test chamber, and the space requirement is a challenge as well. Further, a large distance means large propagation loss inside the test chamber or on the outdoor test range, making it difficult to meet the link budget requirement for performing accurate measurements.

A conventional near field test according to the second method typically uses a much smaller distance between the probe antenna of the test system and the DUT, e.g., a ratio of three wavelengths to ten wavelengths, and also uses the near field to far field translation to derive the far field antenna pattern based on the measured near field complex antenna pattern. However, such an approach has practical limitations for the active massive MIMO device test as well. To determine the far field antenna pattern, the measured near field antenna pattern should cover a majority of the radiated beams of the near field complex antenna pattern, which is time consuming and inefficient. This is especially true when only the beam peak power or 3 dB beam power measurement is needed. Also, conventional near field to far field translation only applies to continuous waveform (CW) signals, and not to broadband modulated signals. Further, the near field to far field translation ultimately requires performance of the complex mathematical solution, which requires significant expenditure of computational time and resources, as mentioned above.

In a recent third method recently developed by the inventors of the instant System and Method for Obtaining Far Field Radiated Power with Multiple Radiated Power Measurements in Middle Field Range, a correction table is used to obtain the far field radiated power based on a single measurement of radiated power in the middle field by correcting the single measurement of radiated power in the middle field using the correction table. In this development, the correction table can be achieved in two ways. First, a white box test can be used, which means that information about antenna array size, antenna elements position and beamforming weights is required to calculate the correction number. Second, the actual far field testing described above can be used to derive the difference between far field and middle field measurements as the correction number. In the case of the white box, the required information may be available for research and development engineers responsible for developing the DUT, but is not typically readily provided for, e.g., external certifications and manufacturing tests. Detailed information that may be particularly difficult to obtain is the beamforming weights. In the case of the actual far field testing, the far field test conditions can be challenging for a large size antenna array under test (AUT), among other potential problems.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

Figure 1:
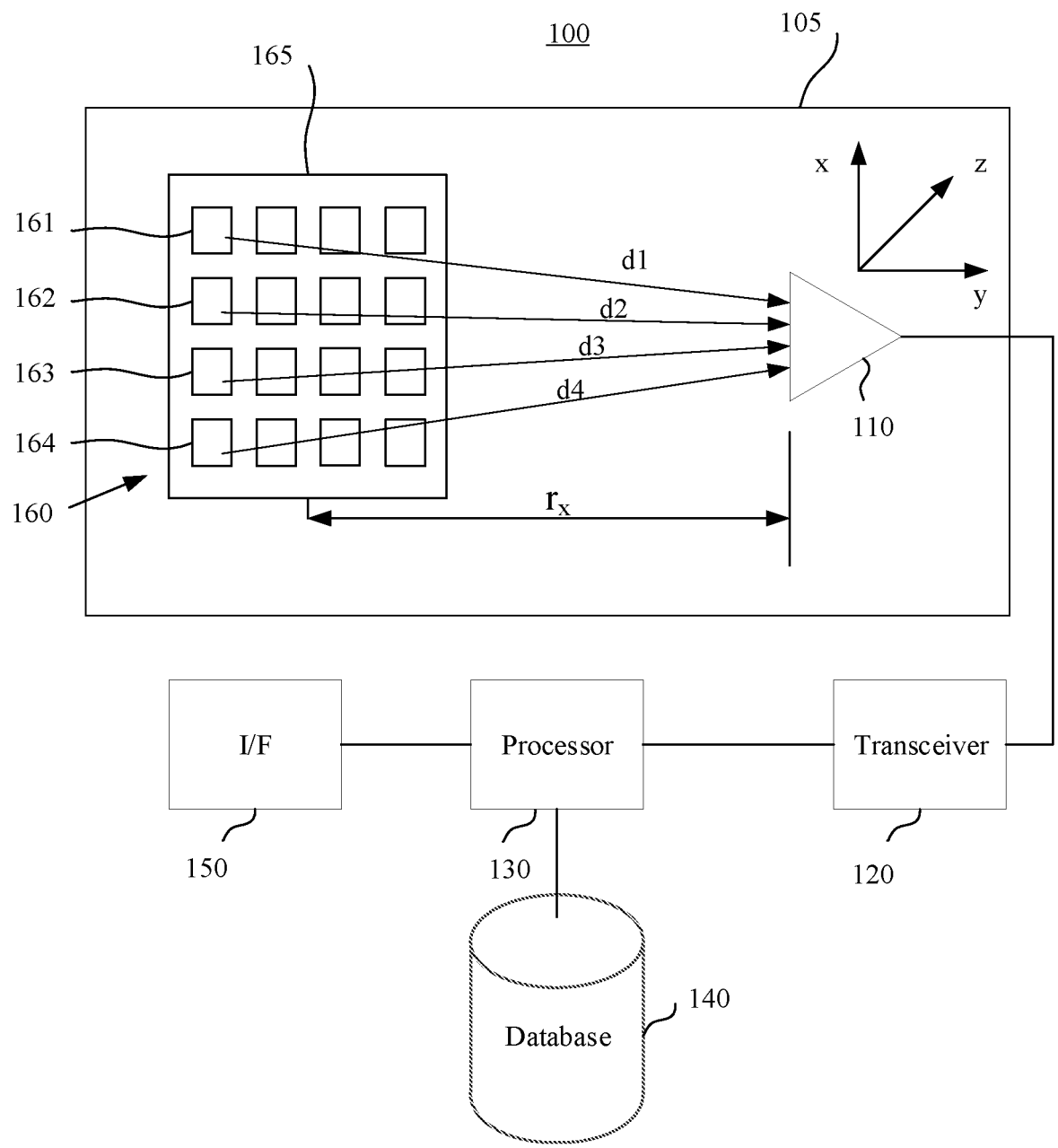
FIG. 1 is a simplified block diagram of a test system for determining a far field antenna pattern of an antenna array, including multiple antenna elements, of a device under test (DUT), according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

According to various embodiments, test systems and methods are provided for testing a device under test (DUT), such as a base station or a mobile communication device, that includes an antenna array with multiple antenna elements. Measurements of antenna array beam radiated power may be made using a probe antenna of the test system for receiving radio frequency (RF) signals from the antenna array, where the probe antenna is located in a middle field of the DUT. The middle field refers to a distance from the DUT that satisfies the far field requirement for each individual antenna array element, but is still the near field for the antenna array itself. Accordingly, the antenna pattern for the antenna array in the far field of the antenna array can be determined based on measurements of the RF signal pattern in the middle field (e.g., by measuring the radiated power of the main beam) in two or more locations. As compared to conventional direct far field measurements, a large test chamber is not required, addressing issues regarding expense, space and excessive path loss during testing. As compared to conventional near field testing, including mathematical transformation from near field to far field, the embodiments can test EIRP, for example, quickly and do not need complex antenna pattern measurements (e.g., complex 3D antenna pattern measurements) or complex mathematical translations.

FIG. 1 is a simplified block diagram of a test system for determining a far field antenna pattern of an antenna array, including multiple antenna elements, of a DUT, according to a representative embodiment.

Referring to FIG. 1, test system 100 includes a test chamber 105 that contains a probe antenna 110 for receiving RF signals from an antenna array 165 of DUT 160 which is representative of DUTs in FIG. 1. The test chamber 105 may be an anechoic test chamber configured to contain the probe antenna 110 and the DUT 160. In some embodiments described herein, a length of the anechoic test chamber is less than the far field of the antenna array 165 of the DUT 160. In an embodiment, the test chamber 105 may be an anechoic test chamber with electromagnetic wave absorbing material, such as absorbing foam, covering the interior walls. The electromagnetic wave absorbing material minimizes reflections from the internal walls, e.g., by several tens of decibels, reducing interference during testing of the antenna array 165. The probe antenna 110 may be rotatable in order to accommodate measurement of power in two-dimensional (2D) and/or three-dimensional (3D) antenna patterns radiated from the antenna array 165 in different directions. The rotation may take place around one or more axes, indicated by the x, y and z axes of the coordinate grid shown in FIG. 1. The rotation of the probe antenna 110 may be controlled by processor 130, for example, as discussed below.

The antenna array 165 includes a 4×4 array of antenna elements, including antenna elements 161, 162, 163 and 164 which are representative of antenna elements in FIG. 1. The probe antenna 110 is positioned a test distance $r_x$ from the antenna array 165 in a middle field of the antenna array 165. The test distance $r_x$ is representative of multiple test distances $r_1$ to $r_n$ ($r_1 \ldots r_n$) in the middle field of the antenna array 165. For each of the multiple test distances $r_1$ to $r_n$, the test distance $r_x$ is taken from a rotation center of the antenna array 165.

The middle field is defined as an area within the test chamber 105 that satisfies near field criteria for the antenna array 165 and also satisfies far field criteria for each antenna element (including the antenna elements 161, 162, 163 and 164) of the multiple antenna elements in the antenna array 165. A test range meeting these conditions is characterized by peak EIRP being in the same directions in the middle field and the far field, and the nulling area lows being in the same directions in the middle field and in the far field. By way of explanation, a null is an area or vector in an antenna's radiation pattern where the signal cancels out almost entirely, and these nulls can be seen at the lows in the plots of FIGS. 5 and 6 herein. The common directionality in EIRP peaks and nulling areas between the middle field and far field means that the measured antenna array pattern shape in the middle field is similar to the measured antenna array pattern shape in the far field, though the absolute gains of measurements vary both in different directions and between the middle field and the far field in a single direction.

More generally, the antenna array 165 comprises an M×N array of antennae, where M and N are positive integers, respectively, e.g., separated from one another by λ/2. Of course, other sizes and arrangements of antenna arrays (or of multiple antennas not operating as an antenna array) may be implemented without departing from the scope of the present teachings. The antenna elements 161, 162, 163 and 164, for example, provide analog mmW RF signals to the probe antenna 110 over distances $d_1$, $d_2$, $d_3$ and $d_4$, respectively, in accordance with corresponding element antenna patterns.

In the depicted embodiment, for purposes of illustration, the test system 100 further includes transceiver 120, the processor 130, memory 140 and user interface (I/F) 150. The transceiver 120 is an example of at least one component that may include at least one receiver configured to receive the RF signals from the DUT 160 in a receive mode via the probe antenna 110. The transceiver 120 may also include at least one transmitter configured to transmit RF signals to the DUT 160 in a transmit mode via the probe antenna 110, although for ease of illustration, the functionality of the test system 100 is described with the transceiver 120 in the receive mode. Accordingly, at least one component such as the transceiver 120 is configured to at least one of transmit radio frequency (RF) signals to the DUT 160 or receive radio frequency (RF) signals transmitted from the DUT 160 via the antenna array 165. It is understood that the description herein applies to the transceiver 120 in the transmit mode, as well. The transceiver 120 is shown outside the test chamber 105 and is configured to communicate with the probe antenna 110 over a physical connection (as shown), such as a cable, passing through the wall(s) of the test chamber 105. Alternatively, the transceiver 120 may communicate wirelessly with the probe antenna 110, without departing from the scope of the present teachings.

The processor 130 is programmed to control the positioning of the probe antenna 110, and to perform the antenna pattern measurements of the antenna array 165 and the individual antenna elements, including the antenna elements 161, 162, 163 and 164 which are representative of antenna elements in FIG. 1, using demodulated signals received from the transceiver 120. Measuring antenna patterns may be performed by measuring the radiated power of one or more beams from the antenna array 165 and/or from the individual antenna elements. In an embodiment, measuring the antenna pattern of the antenna array 165 may refer to measuring radiated power of a main beam (or main lobe) of the antenna array 165. In other embodiments, the measured radiated power may be from side beams rather than the main beam.

The memory 140 may be a memory device that stores instructions that, when executed, determine an antenna pattern located in a far field of the antenna array 165. For example, the memory 140 may be a memory device that stores and/or that is configured to store at least a portion of the antenna pattern measurement results. The memory 140 may also or alternatively be a memory device that stores and/or that is configured to store instructions such as predetermined instructions for determining the RF signal antenna pattern at a third position in the far field as described herein. The memory 140 is accessible by the processor 130, which retrieves stored instructions to determine the RF signal antenna pattern in the far field.

Figure 5:
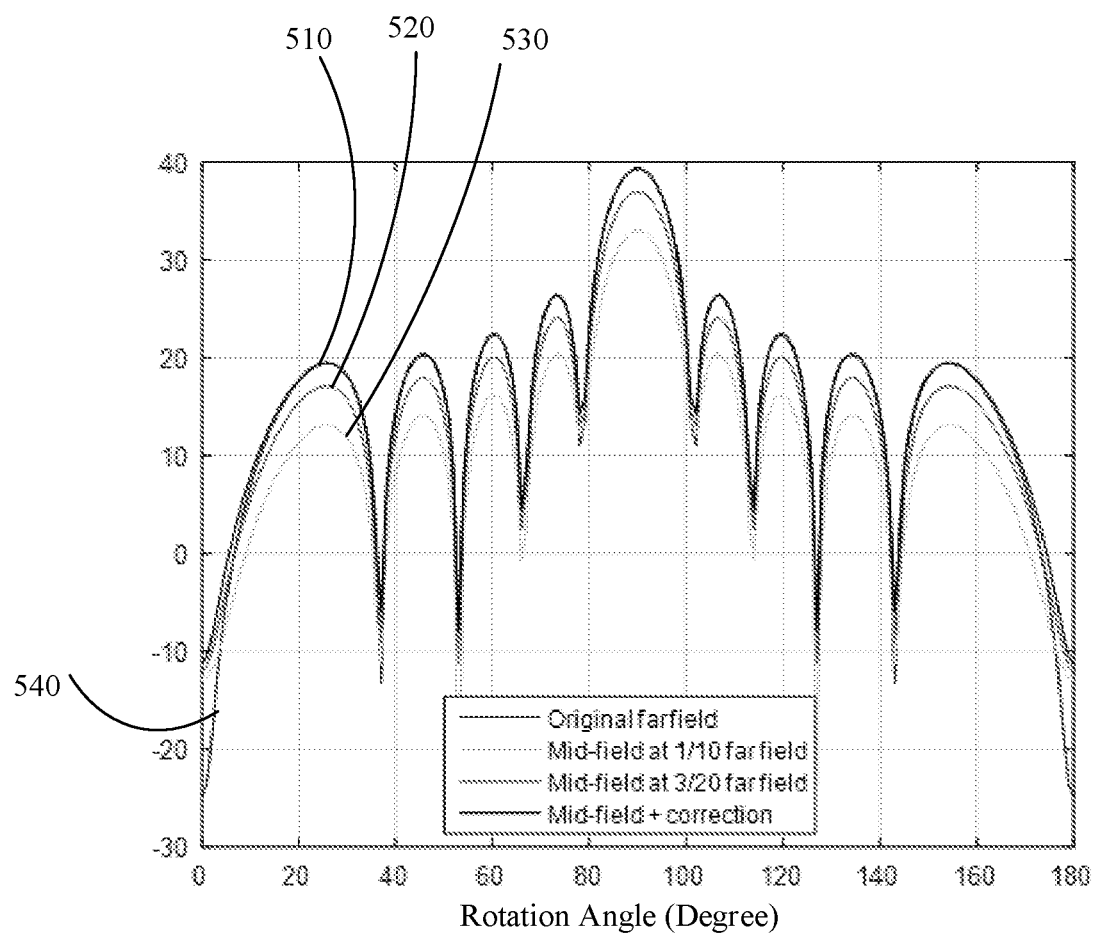
FIG. 5 is a plot showing examples of a simulated far field antenna pattern versus a derived far field antenna pattern based on simulated patterns at different test distances for a beamforming direction equal to 90 degrees, according to a representative embodiment.
Figure 6:
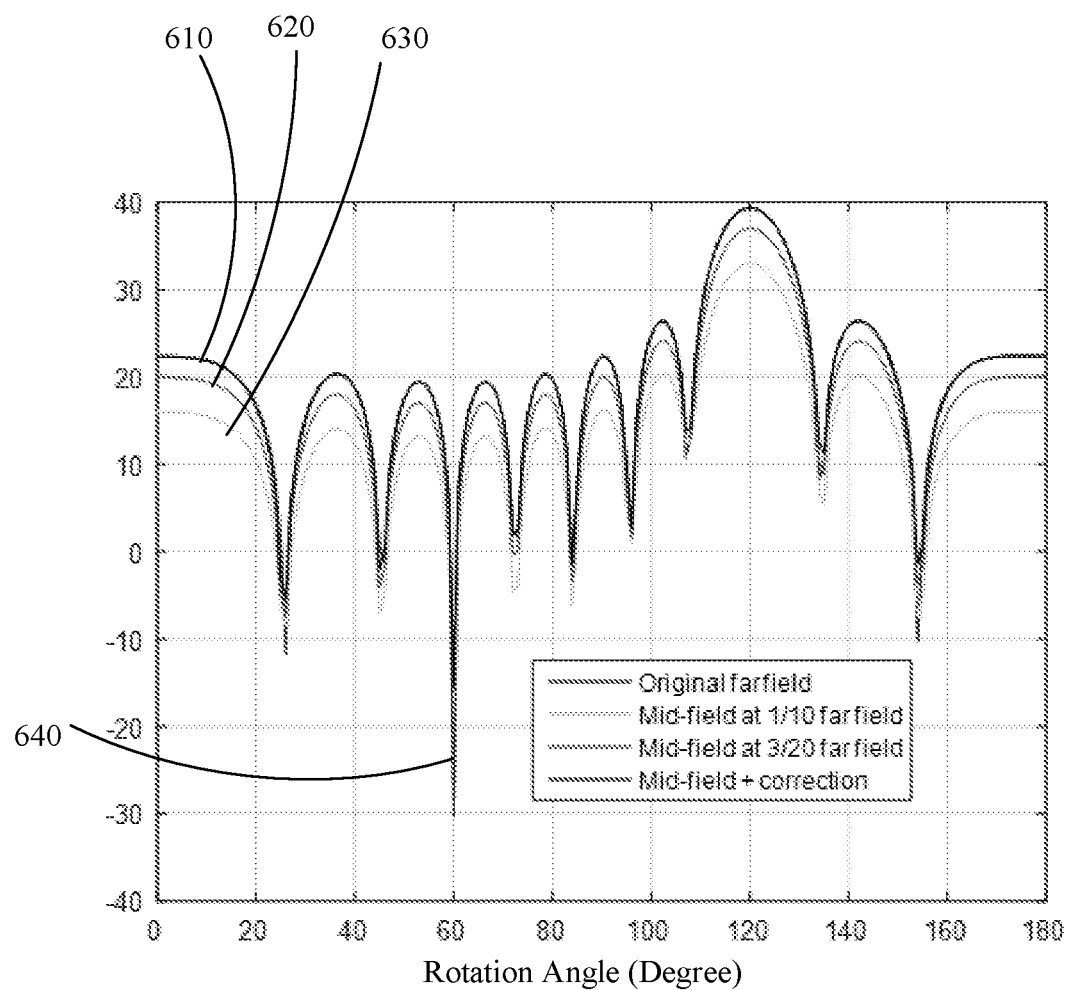
FIG. 6 is a plot showing examples of a simulated far field antenna pattern versus a derived far field antenna pattern based on simulated patterns at different test distances for a beamforming direction equal to 120 degrees, according to a representative embodiment.

The I/F 150 enables interfacing with a user and/or another test device. The I/F 150 may include a display (not shown) configured to display antenna patterns corresponding to different near field and far field positions (e.g., examples of which are shown in FIGS. 5 and 6) and at least a portion of the testing results. The I/F 150 may also include a user input device (not shown) configured to receive user commands and/or data entry, such as coordinates of positions in the far field of the antenna array 165 for which determination of an antenna pattern is desired. The user input device may include a keyboard, a mouse, a touch pad and/or a touch-sensitive display, although any other compatible means of providing input and receiving output may be incorporated without departing from the scope of the present teachings.

The processor 130 may be implemented by a computer processor, application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include its own memory (e.g., a nonvolatile memory that is separate from the memory 140) for storing executable software/firmware executable code that allows it to perform the various functions. In an embodiment, the computer processor may comprise a central processing unit (CPU), for example, executing an operating system.

The memory 140 may be implemented by any number, type and combination of random access memory (RAM) and read-only memory (ROM), for example, and may store various types of information, such as computer programs and software algorithms executable by the processor 130 (and/or other components), as well as raw data and/or testing and measurement data storage, for example. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are tangible and non-transitory storage media (e.g., as compared to transitory propagating signals).

In FIG. 1, middle field radiated power from the antenna array 165 can be measured at multiple distances in a single direction. The measuring at different distances can be performed repeatedly for multiple directions, two-dimensional cuts or three-dimensional surfaces. Any set of multiple measurements in a direction can be applied to the processor 130 for processing via a predictive algorithm to obtain the desired far field RF signal antenna pattern. A predictive algorithm may include multiple steps implemented by a program stored in the memory 140, and example(s) of multiple steps of such a predictive algorithm are explained below. The antenna array 165 can be moved in three dimensions and rotated via a position and rotation system to obtain the measurements at different distances such as a first distance r1 and a second distance r2. The test system 100 illustrated in FIG. 1 can be used with both single tone signals and modulated signals.

In the description of FIG. 1 above, the discussion mainly focuses on the measurement of transmitted two-dimensional (2D) and/or three-dimensional (3D) antenna patterns radiated from the antenna array 165. However, the teachings of FIG. 1 and other embodiments herein are equally applicable to measurements of a receiver antenna pattern so long as the receiver antenna pattern is maintained unchanged during the test. That is, a method for testing an antenna array of a device under test may include using a probe antenna for at least one of transmitting radio frequency (RF) signals to the antenna array or receiving radio frequency signals from the antenna array. For example, in the conventional DUTs with radio frequency connectors, such as coaxial connectors, the power measurement of received power can be made at the RF connector. In modern integrated DUTs without radio frequency connectors, the DUT itself may report received power for the power measurement and this device reported receive power can be used for the power measurement. The device reported receive power can be used for DUTs such as base stations and handsets with an integrated baseband. Some level of calibration may be required, but the teachings of the present disclosure are equally applicable to receiver antenna patterns and not only transmitter antenna patterns.

Figure 2A:
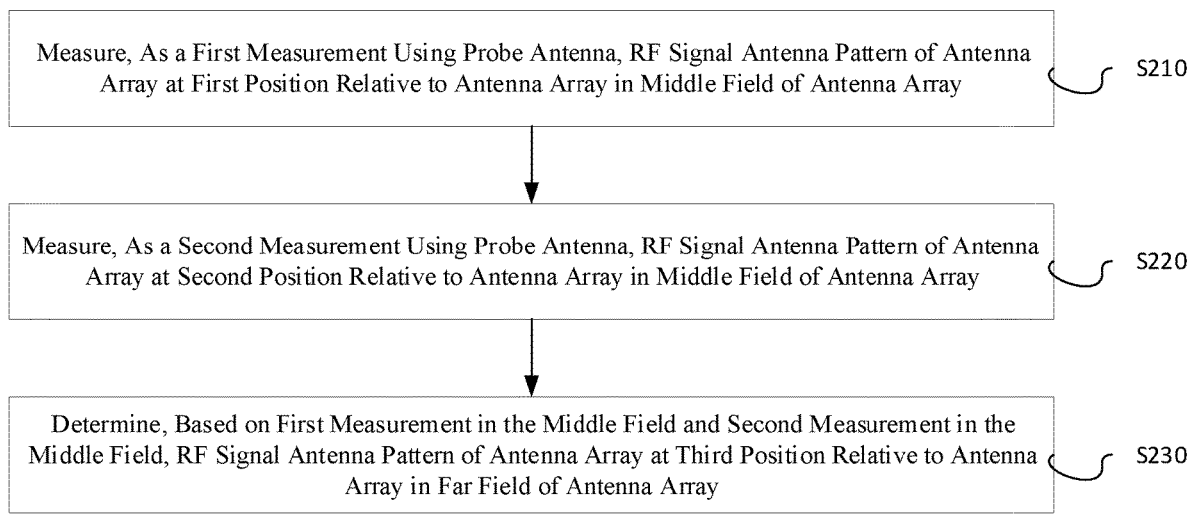
FIG. 2A is a flow diagram showing a method for determining a signal antenna pattern in a far field of an antenna array of a DUT using a probe antenna in a middle field of the antenna array, according to a representative embodiment.

FIG. 2A is a flow diagram showing a method for determining a signal antenna pattern in a far field of an antenna array of a DUT using a probe antenna in a middle field of the antenna array, according to a representative embodiment.

Referring FIG. 2A, the method includes measuring at block S210 an RF signal antenna pattern of the antenna array as a first measurement using a probe antenna. The RF signal antenna pattern is measured at block S210 at a first position relative to the antenna array in a middle field of the antenna array. The first position may be located at a first distance from the antenna array in the middle field of the antenna array. For example, the first measurement may be made by the probe antenna 110 of the test system 100 which is illustratively shown in FIG. 1. The first measurement may be made at the first of multiple positions in a single direction and may be a measurement of radiated power from the antenna array 165 in the middle field of the antenna array 165 at the first position. As discussed above, the middle field of the antenna array 165 is the set of distances from the DUT 160 that satisfy the far field requirement for each individual antenna array element (e.g., including antenna elements 161, 162, 163, 164), but are still within the near field for the antenna array 165. The antenna pattern measurement at S210 may include measuring radiated power of a main beam or a side beam of the antenna array 165, for example. As an example, a far field and a near field may be delineated based on a multiple of wavelength of a test signal. When the test distance is greater than the delineated distance, the path loss for the antenna array may satisfy $2\pi r/\lambda$ such that a plot of EIRP measurements becomes substantially linear, and this may define the far field. When the test distance is lower then the delineated distance and in an area where the beam pattern gain approaches linearity but is not fully formed, this may correspond to the middle field. When the beam pattern gain of the antenna array is in an area that does not present a stable test environment (which may be referred to as the reactive near field region), this may define the near field.

In block S220, the RF signal antenna pattern of the antenna array is measured as a second measurement using the probe antenna. At block S220, the RF signal antenna pattern is measured at a second position relative to the antenna array in the middle field of the antenna array. The second position may be located at a second distance from the antenna array in the middle field of the antenna array. The second distance may be different from the first distance, and both the first distance and the second distance may be in a single direction from the antenna array. The second measurement may also be made by the probe antenna 110 of the test system 100 which is illustratively shown in FIG. 1. The second measurement may be made at the second of multiple positions in a single direction and may also be a measurement of radiated power from the antenna array 165 in the middle field of the antenna array at the second position. The antenna pattern measurement at S220 may include measuring radiated power of a main beam or a side beam of the antenna array 165, for example.

In block S230, the RF signal antenna pattern of the antenna array is determined at a third position relative to the antenna array in the far field of the antenna array. The third position may be determined by a user, for example, as the location in the far field for which the antenna pattern is sought. The third position may be located at a third distance from the antenna array, but now in the far field of the antenna array. The third distance is different from the first distance and the second distance, and all three of the first distance, the second distance and the third distance may be in a single direction from the antenna array. The determination of the RF signal antenna pattern at the third position at S230 may be made by the processor 130 of the test system 100 which is illustratively shown in FIG. 1. The determination may be made by the processor 130 executing instructions from the memory 140 based on the first measurement in the middle field of the antenna array 165 and based on the second measurement in the middle field of the antenna array 165.

As described above, the first position and the second position may be in a single direction from the antenna array. The radiated power of the RF signal antenna pattern of the antenna array at the third position as determined at block S230 may vary based on several factors, including based on direction from the antenna array for a single antenna pattern; and based on the beamforming coefficients, azimuth angles and/or elevation angles of antenna elements of the antenna array used to produce the antenna pattern. Therefore, even for a single individual RF signal antenna pattern from an antenna array, radiated power measured at the same distance from a center but in different directions may vary. When the beamforming coefficients are not known, measurements in the middle field such as the first measurement and the second measurement can still be used to determine the far field antenna pattern for the antenna array. Accordingly, the measurements at blocks S210 and S220 in the middle field may be in a single direction from the antenna array, as the determination of the RF signal antenna pattern of the antenna array at positions in the far field may vary based on the direction from the antenna array.

A number of techniques may be used to determine the RF signal antenna pattern in the far field. The techniques result in determinations of differences in radiated power between the first position and the second position in the middle field, and the third position in the far field. The RF signal antenna pattern in the far field corresponds to distances greater than a far field threshold in various directions, over which the far field criteria of the measured radiated power (e.g., EIRP) are satisfied for the antenna array 165. When the far field criteria are satisfied, the antenna pattern will be independent of the test position because the power loss caused by the test distance will be removed from the corresponding measured radiated power.

Generally, the determination of the RF signal antenna pattern in the far field at block S230 is based on the measurements in the middle field at the first position and the second position, and based on geometry data for the antenna array 165, distance information between the probe antenna 110 and the DUT 160, carrier frequency of the RF signal, and beam directions of the antenna array 165.

Figure 2B:
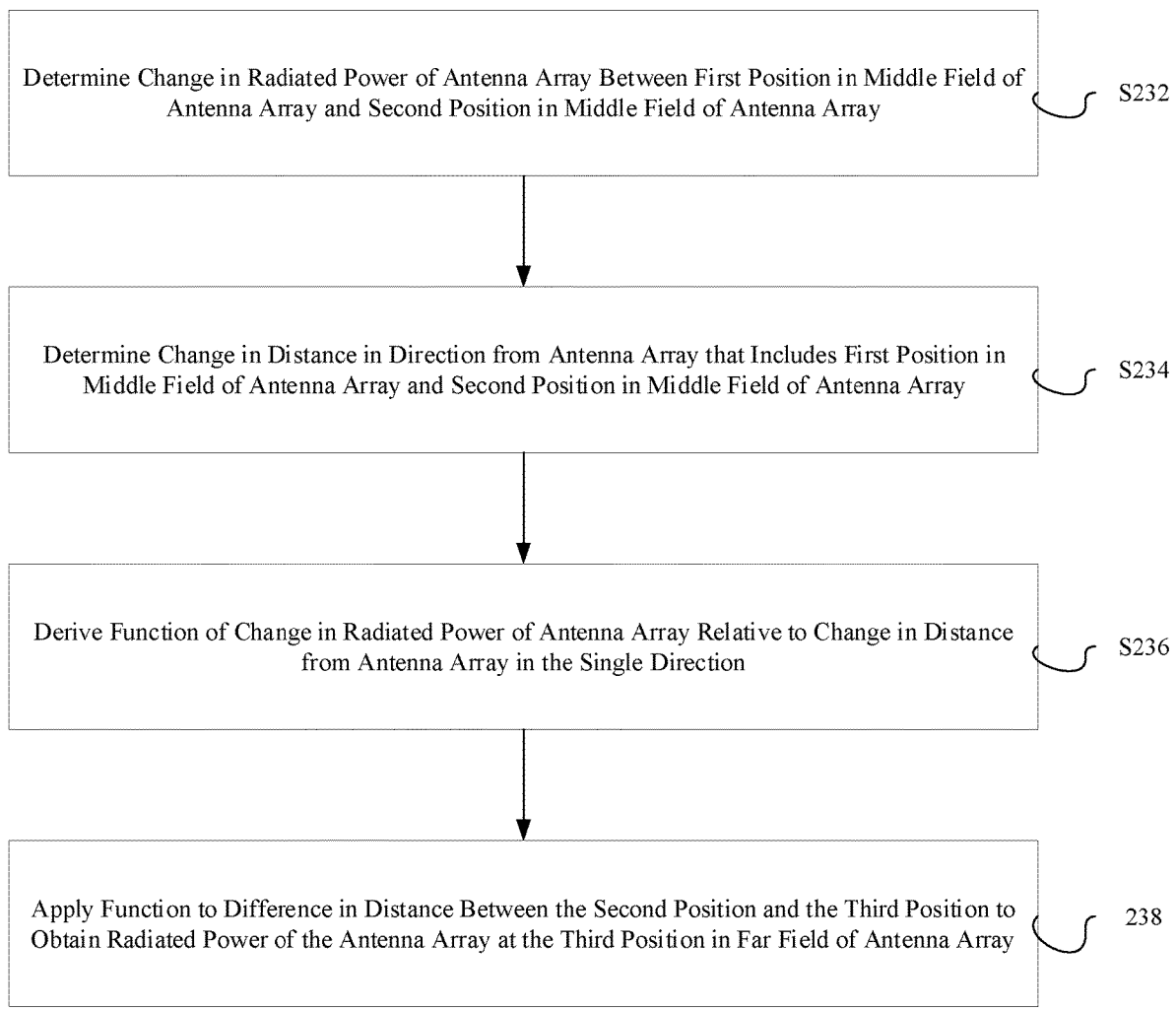
FIG. 2B is a flow diagram showing a method for determining a signal antenna pattern in a far field of an antenna array of a DUT using a probe antenna in a middle field of the antenna array, according to a representative embodiment.

FIG. 2B is a flow diagram showing a method for determining a signal antenna pattern in a far field of an antenna array of a DUT using a probe antenna in a middle field of the antenna array, according to a representative embodiment.

The method depicted in FIG. 2B includes determining at block S232 a change in radiated power of the antenna array 165 between the first position in the middle field of the antenna array 165 and the second position in the middle field of the antenna array 165. Though the measurements at the first position and the second position are performed once each, the radiated power measured at each position is the power emitted as far field antenna patterns of the multiple antenna elements (e.g., antenna elements 161, 162, 163, 164) in the antenna array 165 in the middle field of the antenna array 165. The measurements at the first position and the second position may be performed using the antenna array 165 and a probe antenna 110. The change in radiated power may be determined as a simple subtraction between the measured radiated power at the first position and the measured radiated power at the second position.

In block S234, a change in distance from the antenna array is determined between the first position and the second position in a single direction from the antenna array. The change in distance may be measured for each of the first position and the second position relative to a single point of the antenna array, such as a center of the antenna array.

In block S236, a function of change in radiated power of the antenna array is derived relative to the change in distance from the antenna array in a single direction determined at block S234. The function of change derived at block S236 may be a simple derivation of change in radiated power relative to change in distance in a single direction. However, as explained herein, the function of change may reflect complexities based on assumptions, calculations, translations, projections and estimations that vary for different embodiments. Accordingly, a method for testing an antenna array that includes determining the RF signal antenna pattern at a third position relative to the antenna array located in a far field of the antenna array may include deriving a function of change in radiated power, as in block S236.

In block S238, the function of change is applied to the difference in distance between the second position and the third position to obtain the radiated power of the antenna array at the third position in the far field of the antenna array. The function of change may be applied as a linear translation to the difference in distance between the second position and the third position in any embodiment. Alternatively, the function of change may be applied to a difference between the third position and a hybrid or derivative of the combined positions of the first position and the second position. For example, the function of change may be applied to a difference between the third position and the average of the first position and the second position. As explained below, the calculations used to derive the function of change and apply the function of change may have complex underpinnings that are simplified in several ways for different embodiments. Accordingly, a method for testing an antenna array that includes determining the RF signal antenna pattern at a third position relative to the antenna array located in a far field of the antenna array may include applying the function of change to a difference in distance, as in block S238.

If far field antenna patterns of the antenna array 165 were to be calculated at different positions (e.g., different distances $r_x$ and different azimuth and elevation angles ($\vartheta$, $\phi$)) in the far field of the antenna array 165, the calculations could include performing Equation (1), below, for any position in the far field. Notably, the antenna elements (e.g., antenna elements 161, 162, 163, 164) of antenna array 165 do not share the same distance d, angle of arrival (AoA) and angle of departure (AoD) in relation to the probe antenna 110. Therefore, the far field antenna pattern of the antenna array 165 at test distance $r_x$ (e.g., r1 or r2) can be expressed by Equation (1), where y is the antenna pattern for the main beam or side beam of the antenna array 165:

$$y(\vartheta, \phi, r) = \sum_{k=1}^{N} x_k G_k(\theta_k, \varphi_k) \frac{\lambda}{4\pi d_k} \exp\left(j2\pi \frac{d_k}{\lambda}\right) G_P(v_k, \phi_k) \quad \text{Equation (1)}$$

Referring to Equation (1), the variables ($\vartheta$, $\phi$, r) indicate the position of the probe antenna 110 related to the rotation center of the antenna array 165, where ($\vartheta$, $\phi$) are azimuth and elevation angles, respectively, and (r) is an absolute distance (test distance) between the rotation center of the antenna array 165 and the probe antenna 110. With respect to the antenna elements in the antenna array 165, k is an antenna element index for the antenna array, and N is the number of antenna elements contributing to a beam of the antenna array

165, where k and N are each positive integers. When the far field antenna pattern of each of the antenna elements is known, Equation (1) is true for the main beam or side beam of the antenna array 165. But, when the far field antenna patterns of fewer than all of the antenna elements are known, Equation (1) can be applied to estimate the main beam or side beam of the antenna array 165. Also, in the example depicted in FIG. 1, N would be equal to 16, and values of k would be equal to 1, 2, 3 . . . 16.

Still referring to Equation (1), $G_k$ is a far field complex antenna pattern for antenna element k of the multiple antenna elements, $(\theta_k, \varphi_k)$ are azimuth and elevation angles, respectively, of antenna element k of the multiple antenna elements relative to the probe antenna 110, $d_k$ is a distance between antenna element k of the multiple antenna elements to the probe antenna 110, and $x_k$ is a stimulus signal for antenna element k of the multiple of antenna elements. Further, $\lambda$ is the wavelength of the RF signal comprised of beams transmitted by the antenna array 165, $G_P$ is a far field complex antenna pattern for the probe antenna 110, $(\vartheta_k, \phi_k)$ are azimuth and elevation angles, respectively, of the probe antenna 110 relative to antenna element k of the multiple antenna elements, $$\frac{\lambda}{4\pi d_k}$$

is path loss, and $$2\pi \frac{d_k}{\lambda}$$

is phase variation caused by propagation over distance $d_k$. Because for each individual antenna element, the distance $d_k$ is already in the far field, each antenna element's far field pattern can be used, and the corresponding path loss may be regarded as $$\frac{\lambda}{4\pi d_k}.$$

Based on Equation (1), the antenna pattern of the antenna array 165 at different distances $r_x$ in the far field may be calculated based, in part, on the distances $d_k$, all of which are in the middle field of the antenna array 165.

Stated differently, assuming y is the received signal at test distance r, then the power of the received signal y is dependent on the test distance $r_x$. However, when the antenna pattern in the far field is derived, the influence of the test distance r may be easily removed by adding path loss to the power of the received signal y. Accordingly, for the far field, the difference between the received signal y and the antenna pattern is one constant number (the path loss). That is, y is the received signal at test distance $r_x$, and the antenna pattern can be derived from y by factoring out the path loss.

Because Equation (1) can be used to calculate the antenna pattern (in amplitude or power) for the antenna array 165 at different distances r, in the middle field and in the far field, the difference may be determined by subtracting the calculated antenna patterns corresponding to the two different distances r. For example, using Equation (1), antenna pattern y_1 may be calculated assuming r=1 m (which is assumed to be in the middle field), and antenna pattern y_2 may be calculated assuming r=10 m (which is assumed to be in the far field). The difference between the antenna patterns may then be calculated as y_diff=y_2−y_1. Notably, the difference y_diff contains two parts: (i) free-space path loss change, caused directly by the change in test distances, and (ii) composite beam gain variation under the different test distances. The free-space path loss change resulting from the different test distances (1 m and 10 m) can be calculated using a well known free-space path loss equation. Then, the path loss change is deducted from the difference y_diff to determine the difference between the radiated power of a main beam or side beam in the antenna array far field and the radiated power of the main beam or side beam in the antenna array middle field.

Since each antenna element test distance d is in the far field, the far field pattern for each element can be used by regarding the path loss for the far field pattern of each element in Equation (1) as $$\frac{\lambda}{4\pi d_k}.$$

To remove the path loss impact on measured equivalent isotropic radiated power on different test distances d, the normalized antenna pattern as a function of test distance can be expressed by Equation (2) as follows:

$$y(\vartheta, \phi, d) = \sum_{k=1}^{N} x_k G_k(\theta_k, \varphi_k) \frac{\lambda d}{4\pi d_k} \exp\left(j 2\pi \frac{d_k}{\lambda}\right) G_P(\alpha_k, \beta_k) \quad \text{Equation (2)}$$

Assuming that the test distance d is the distance between the center of the AUT and the probe antenna, $d_k$ is the distance between antenna element k of the AUT to the probe antenna, and $l_k$ is the distance difference between test distance d and $d_k$, then $d_k = d + l_k$. Here, $d \gg l_k$, i.e., d is much larger than $l_k$. To make the derivation expression simple, $$c_k(\theta_k, \varphi_k, \alpha_k, \beta_k) = \frac{\lambda}{4\pi} x_k G_k(\theta_k, \varphi_k) G_P(\alpha_k, \beta_k),$$

which allows for Equation (3) as follows:

$$y(\vartheta, \phi, d) = \sum_{k=1}^{N} \frac{c_k d}{d + l_k} \exp\left(j 2\pi \frac{d + l_k}{\lambda}\right) \quad \text{Equation (3)}$$

Normalized power can then be obtained by the following progression of equations shown as the resultant Equation (4):

$$p(\vartheta, \phi, d) = \left|\sum_{k=1}^{N} \frac{c_k d}{d + l_k} \exp\left(j 2\pi \frac{d + l_k}{\lambda}\right)\right|^2 \quad \text{Equation (4)}$$

$$= \left(\sum_{k=1}^{N} \frac{c_k}{1 + \frac{l_k}{d}} \cos\left(2\pi \frac{d + l_k}{\lambda}\right)\right)^2 +$$

$$\left(\sum_{k=1}^{N}\frac{c_k}{1+\frac{l_k}{d}}\sin\left(2\pi\frac{d+l_k}{\lambda}\right)\right)^2$$

$$=\left(\sum_{k=1}^{N}\frac{c_k}{1+\frac{l_k}{d}}\cos\left(2\pi\frac{d+l_k}{\lambda}\right)\right)^2+$$

$$\left(\sum_{k=1}^{N}\frac{c_k}{1+\frac{l_k}{d}}\sin\left(2\pi\frac{d+l_k}{\lambda}\right)\right)^2$$

$$=\sum_{k=1}^{N}\frac{c_k^2}{\left(1+\frac{l_k}{d}\right)^2}+\sum_{k=1}^{N}\sum_{j=1,j\neq k}^{N}\frac{c_k c_j}{\left(1+\frac{l_k}{d}\right)\left(1+\frac{l_j}{d}\right)}\cos\left(\frac{2\pi}{\lambda}(l_k-l_j)\right)$$

In order to investigate the variation of $p(\vartheta, \phi, d)$ as increasing test distance d, the derivation of $p(\vartheta, \phi, d)$ to d can be calculated. Because the change of $G_k(\theta_k, \varphi_k)$, $G_P(\alpha_k, \beta_k)$ and $l_k$ caused by changes in small test distance d can be ignored, and $x_k$ is independent of test distance d, $c_k(\theta_k, \varphi_k, \alpha_k, \beta_k)$ can be regarded as constant when performing the derivation to d. This results in Equation (5) as follows:

$$\frac{\partial p}{\partial d}=\sum_{k=1}^{N}\frac{2c_k^2 l_k}{\left(1+\frac{l_k}{d}\right)^3}d^{-2}+$$

$$\sum_{k=1}^{N}\sum_{j=1,j\neq k}^{N}\frac{c_k c_j\left(\begin{array}{l}l_k\left(1+\frac{l_j}{d}\right)+\\ l_j\left(1+\frac{l_k}{d}\right)\end{array}\right)\cos\left(\frac{2\pi}{\lambda}(l_k-l_j)\right)}{\left(1+\frac{l_k}{d}\right)^2\left(1+\frac{l_j}{d}\right)^2}d^{-2} \quad \text{Equation (5)}$$

Since the test distance $d \gg l_k$, i.e., d is much larger than $l_k$, the ratio $$\frac{l_k}{d}$$

can be approximated as zero, i.e., $$\frac{l_k}{d}\approx 0.$$

This can be approximated by a power function of d as Equation (6) as follows:

$$\frac{\partial p}{\partial d}=ad^{-2}+\Delta(d) \quad \text{Equation (6)}$$

Here $\Delta(d)$ is the residual error caused by approximation. The variable $\alpha$ is representative of the function of the change in power to the change in distance between the first position and the second position in the middle field to the third position in the far field. The variable $\alpha$ is given by Equation (7) as follows:

$$a\approx\sum_{k=1}^{N}2c_k^2 l_k+\sum_{k=1}^{N}\sum_{j=1,j\neq k}^{N}c_k c_j(l_k+l_j)\cos\left(\frac{2\pi}{\lambda}(l_k-l_j)\right) \quad \text{Equation (7)}$$

The variable $\alpha$ may be complicated to calculate directly since $$c_k(\theta_k,\varphi_k,\alpha_k,\beta_k)=\frac{\lambda}{4\pi}x_k G_k(\theta_k,\varphi_k)G_P(\alpha_k,\beta_k).$$

This is particularly true when information on $x_k$, $G_k(\theta_k, \varphi_k)$ and $G_P(\alpha_k, \beta_k)$ is absent, such as when a device manufacturer maintains beamforming coefficients as proprietary information. However, as described herein, the first measurement and the second measurement in the middle field allow for an estimation of the parameter $\alpha$ based on the two measurements in the middle field. Given the estimated function for $$\frac{\partial p}{\partial d},$$

EIRP at either measurement point in the middle field can be used along with the integral operation $$\frac{\partial p}{\partial d}$$

to derive EIRP at an arbitrary distance in the far field using Equation (8) as follows:

$$EIRP(d_f)=EIRP(d_1)+\int_{d_1}^{d_f}\frac{\partial p}{\partial d}d\Delta d \quad \text{Equation (8)}$$

In other words, in Equation (8), the EIRP at a third location in the far field can be derived as an approximation or estimation based on EIRP at either the first location or the second location in the middle field, and the integral shown in Equation (8). From Equation (7) it is clear that the parameter a varies with (i.e., is dependent on) $c_k(\theta_k, \varphi_k, \alpha_k, \beta_k)$. Resultingly, the parameter a varies for different test directions, and this is one reason that the first measurement and the second measurement in the middle field are taken in the same direction from the antenna array. Equation (8) accounts for the absolute gains being different between the first location and the second location and between the third location and either or both of the first location and the second location. Moreover, any offset of the EIRP specific to the directionality of the first location and the second location will still be present in the EIRP determined for the far field using Equation (8).

Figure 2C:
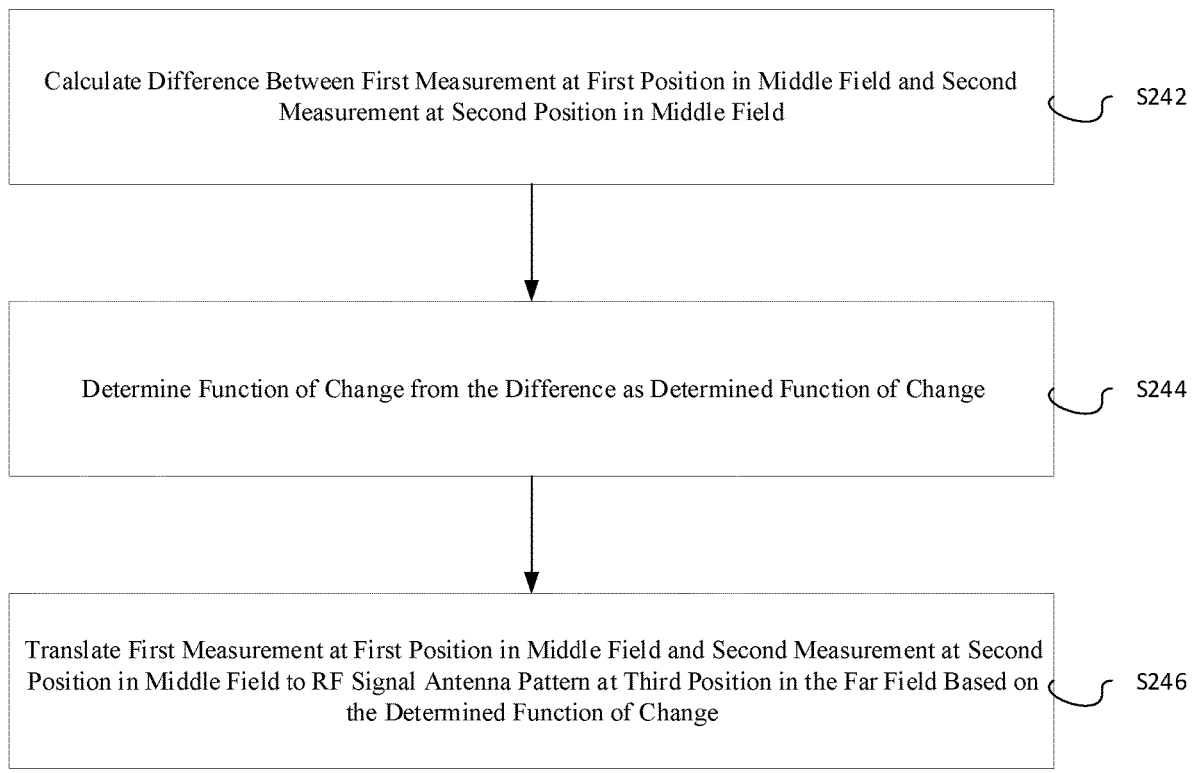
FIG. 2C is a flow diagram showing a method for determining a signal antenna pattern in a far field of an antenna array of a DUT using a probe antenna in a middle field of the antenna array, according to a representative embodiment.

FIG. 2C is a flow diagram showing a method for determining a signal antenna pattern in a far field of an antenna array of a DUT using a probe antenna in a middle field of the antenna array, according to a representative embodiment.

In FIG. 2C, the process starts at block S242 by calculating a difference between a first measurement at a first position in the middle field and a second measurement at a second position in the middle field. At block S244, the function of change is determined from the difference calculated at block S242 as a determined function of change.

At block S246, the first measurement at the first position in the middle field and the second measurement at the second position in the middle field may be translated to the RF signal antenna pattern at a third position in the far field based on the determined function of change. For example, Equation (8) may be used to translate the EIRP from the first measurement at the first position in the middle field and the second measurement at the second position in the middle field to the RF signal antenna pattern at the third position in the far field based on the determined function of change. In an embodiment, the translation may be individually from each of the first position in the middle field and the second position in the middle field based on Equation (8). In another embodiment, the first position and the second position may be averaged, and the first measurement and the second measurement may be averaged, and the average measurement at the average position may be used as the EIRP($d_1$) in Equation (8). From a calculation standpoint, the locations and radiated power measurements in the middle field may be all that is necessary to calculate EIRP($d_f$) in one of several possible ways using Equation (8).

Figure 2D:
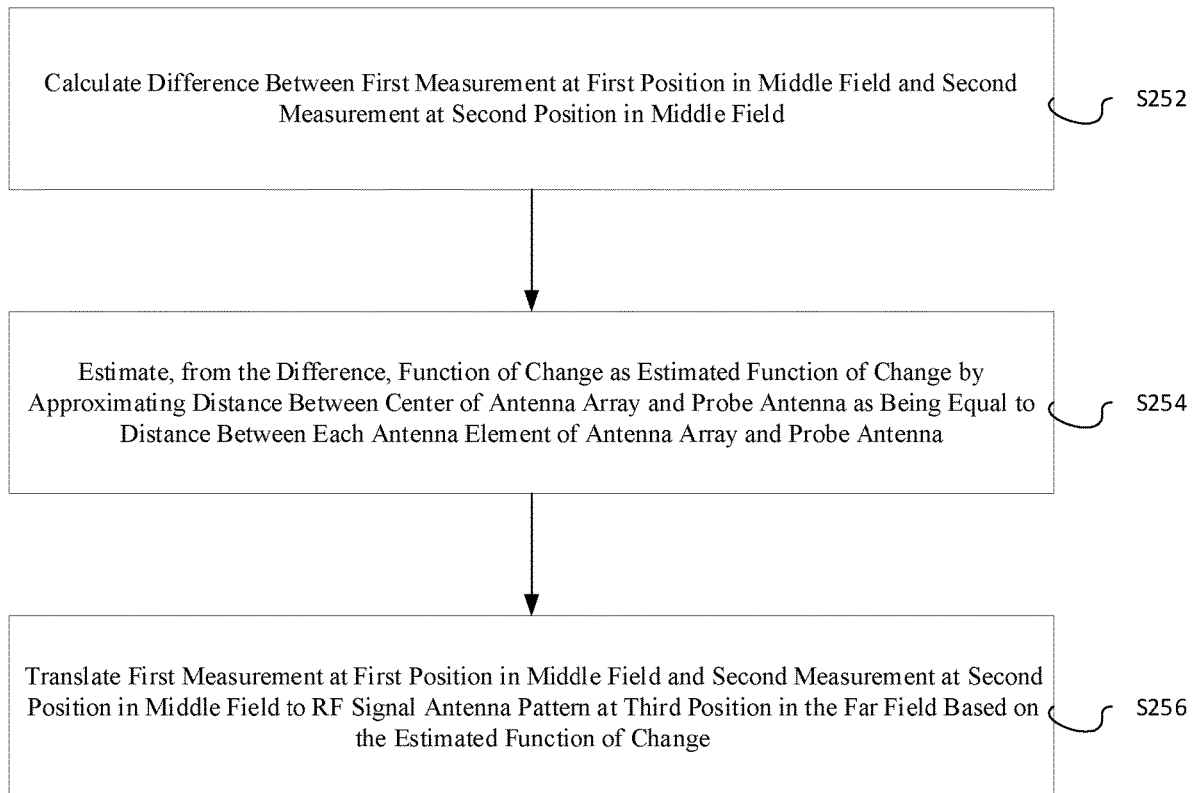
FIG. 2D is a flow diagram showing a method for determining a signal antenna pattern in a far field of an antenna array of a DUT using a probe antenna in a middle field of the antenna array, according to a representative embodiment.

FIG. 2D is a flow diagram showing a method for determining a signal antenna pattern in a far field of an antenna array of a DUT using a probe antenna in a middle field of the antenna array, according to a representative embodiment.

In FIG. 2D, the process starts at block S252 by calculating a difference between a first measurement at a first position in the middle field and a second measurement at a second position in the middle field. At block S254, a function of change is estimated from the difference as an estimated function of change. The function of change is estimated by approximating the distance between the center of the antenna array and the probe antenna as being equal to the distance between each antenna element of the antenna array and the probe antenna. In other words, the distance between the antenna array and the probe antenna is estimated to be the same for all elements of the antenna array. Accordingly, a method for testing an antenna array that includes deriving the function of change in radiated power of the antenna array may include estimating the function of change from the difference between the first measurement at the first position and the second measurement at the second position, as in block S254.

At block S256, the process of FIG. 2D includes translating the first measurement at the first position in the middle field and the second measurement at the second position in the middle field to the RF signal antenna pattern at the third position in the far field. The translation at block S256 is based on the function of change estimated at block S254.

Figure 2E:
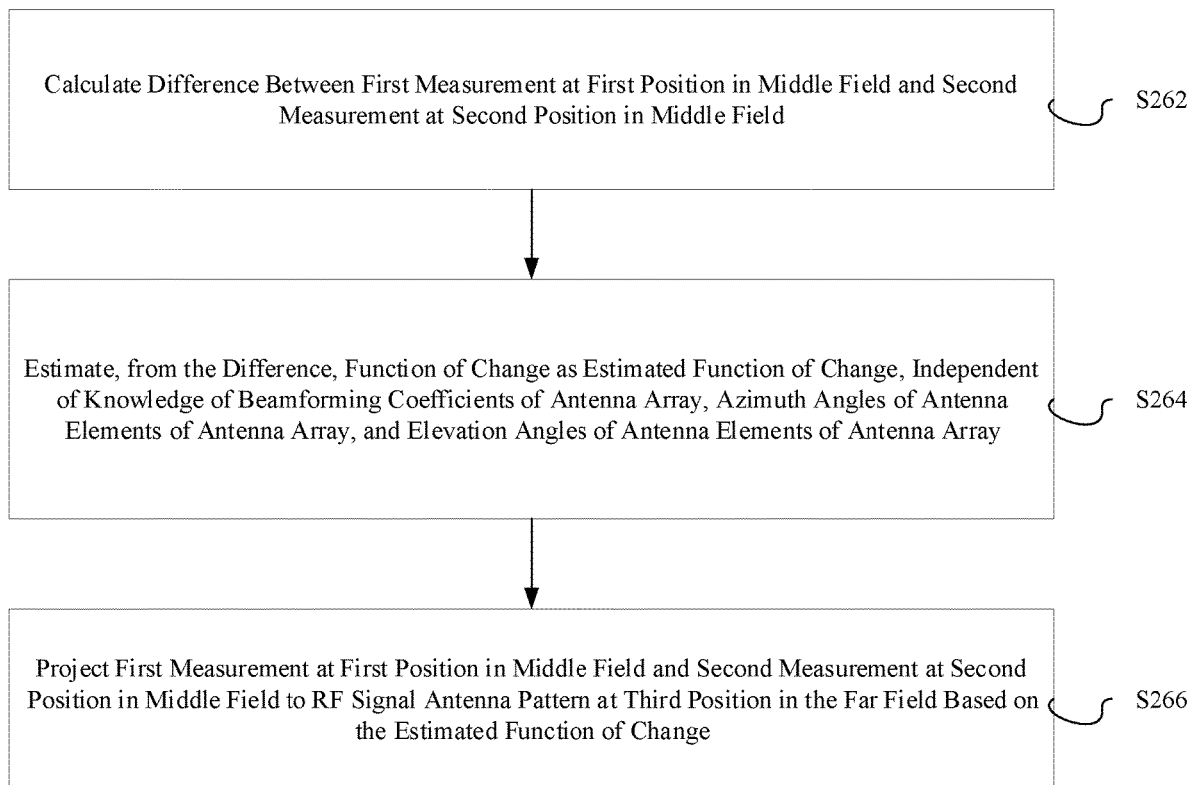
FIG. 2E is a flow diagram showing a method for determining a signal antenna pattern in a far field of an antenna array of a DUT using a probe antenna in a middle field of the antenna array, according to a representative embodiment.

FIG. 2E is a flow diagram showing a method for determining a signal antenna pattern in a far field of an antenna array of a DUT using a probe antenna in a middle field of the antenna array, according to a representative embodiment.

In FIG. 2E, the process starts at block S262 by calculating a difference between a first measurement at a first position in the middle field and a second measurement at a second position in the middle field. At block S264, a function of change is estimated from the difference as an estimated function of change. In FIG. 2E, the function of change is estimated independent of knowledge of beamforming coefficients of the antenna array, azimuth angles of antenna elements of the antenna array, and elevation angles of the antenna elements of the antenna array. For example, the process of FIG. 2E may be performed without knowledge of the beamforming coefficients, azimuth angles and elevation angles, such as when this information is not provided by a manufacturer to an entity performing tests on manufactured communications equipment. Accordingly, a method for testing an antenna array that includes deriving the function of change in radiated power of the antenna array may include estimating the function as an estimated function of change, independent of knowledge of beamforming coefficients of the antenna array as at S264.

In another embodiment, the function of change in FIG. 2E can be estimated at block S264 independent of knowledge of some but not all of the beamforming coefficients, azimuth angles, and elevation angles. For example, the RF signal antenna pattern at the third position can be determined based on a function of change determined independent of knowledge of beamforming coefficients used to generate the RF signal antenna pattern.

At block S266, the first measurement at the first position in the middle field and the second measurement at the second position in the middle field are projected to the RF signal antenna pattern at the third position in the far field based on the estimated function of change. The projection may be from the measurements only at the first position, only at the second position, from a hybrid of the measurements at the first position and the second position, or from both measurements at the first position and at the second position. Accordingly, a method for testing an antenna array that includes determining of an RF signal antenna pattern at the third position may include projecting the first measurement at the first position in the middle field and/or projecting the second measurement at the second position in the middle field to the RF signal antenna pattern of the antenna array at the third position in the far field, as in block S266.

As noted previously, projections from positions in the middle field to the far field may be made based on Equation (8) and the measured radiated power at each or either of the first position and the second position. Furthermore, the projections from positions in the middle field to positions in the far field may vary based on the specific direction of the projection, which implicitly reflects the variability of the beamforming coefficients, azimuth angles and elevation angles used to generate the RF signal antenna. Accordingly, even when the beamforming coefficients, azimuth angles and elevation angles are unknown by the entity controlling the process at FIG. 2E, the beamforming coefficients, azimuth angles and elevation angle may still implicitly affect the measurements and thus the projection to the far field.

Figure 2F:
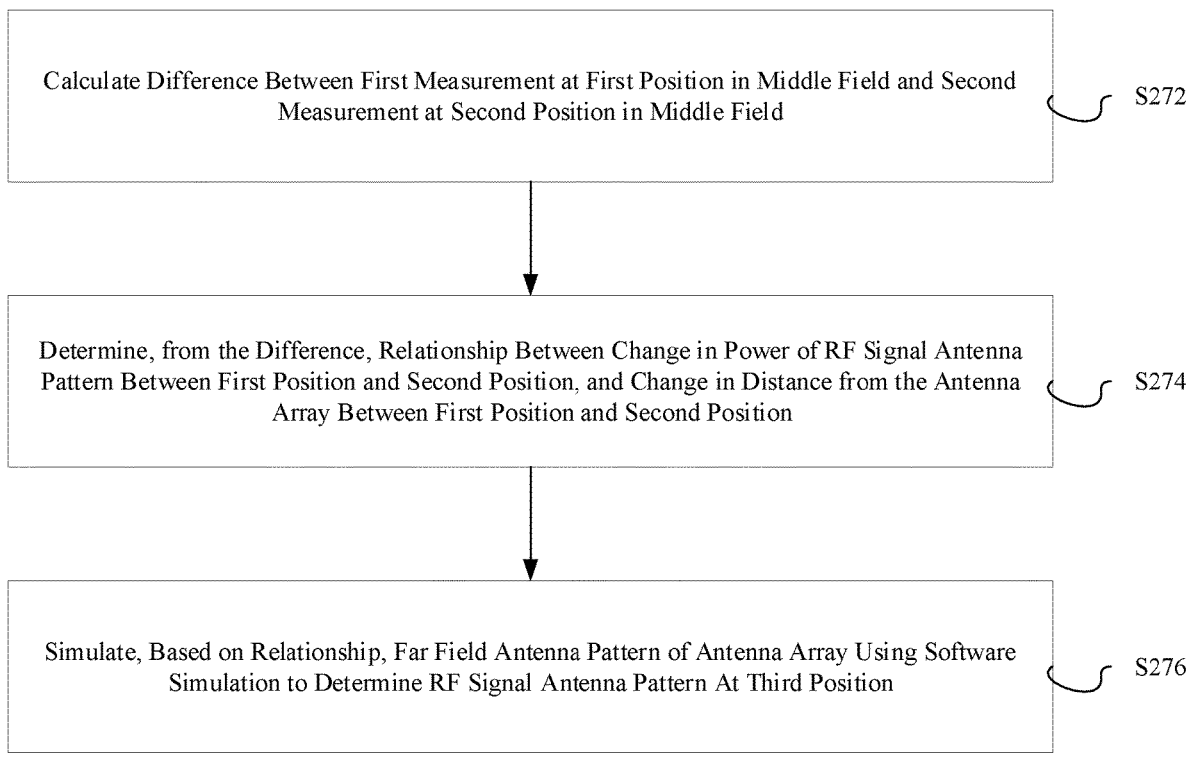
FIG. 2F is a flow diagram showing a method for determining a signal antenna pattern in a far field of an antenna array of a DUT using a probe antenna in a middle field of the antenna array, according to a representative embodiment.

FIG. 2F is a flow diagram showing a method for determining a signal antenna pattern in a far field of an antenna array of a DUT using a probe antenna in a middle field of the antenna array, according to a representative embodiment.

In FIG. 2F, the process starts at block S272 by calculating a difference between a first measurement at a first position in the middle field and a second measurement at a second position in the middle field. At block S274, a relationship between a change in power of the RF signal antenna pattern and a change in distance from the antenna array is determined from the difference calculated at block S272. Specifically, the change in power of the RF signal antenna pattern between the first position and the second position is identified and used as a numerator or denominator. The change in distance from the antenna array between the first position and the second position is also identified and used as the denominator or numerator. In other words, a S274, the change in power and the change in distance can be related to one another, such as by an equation.

At block S276, the far field antenna pattern of the antenna array is simulated using a software simulation to determine the RF signal antenna pattern at the third position. The simulation at block S276 is performed based on the relationship determined at block S274. The software used to perform the software simulation may be stored in the memory 140 and executed by the processor 130 in the test system 100 that is illustrative in FIG. 1. The simulation at S276 may be performed, for example, using simulation tools, such as Electromagnetic Professional (EMPro) available from Keysight Technologies, Inc., or a High Frequency Structure Simulator (HFSS), generally, which are able to generate antenna element patterns based on electromagnetic field simulations. Accordingly, a method for testing an antenna array that includes determining the RF signal antenna pattern at the third position relative to the antenna array may include simulating a far field antenna pattern of the antenna array as in block S276, for example based on a relationship as determined as in block S274.

Figure 3:
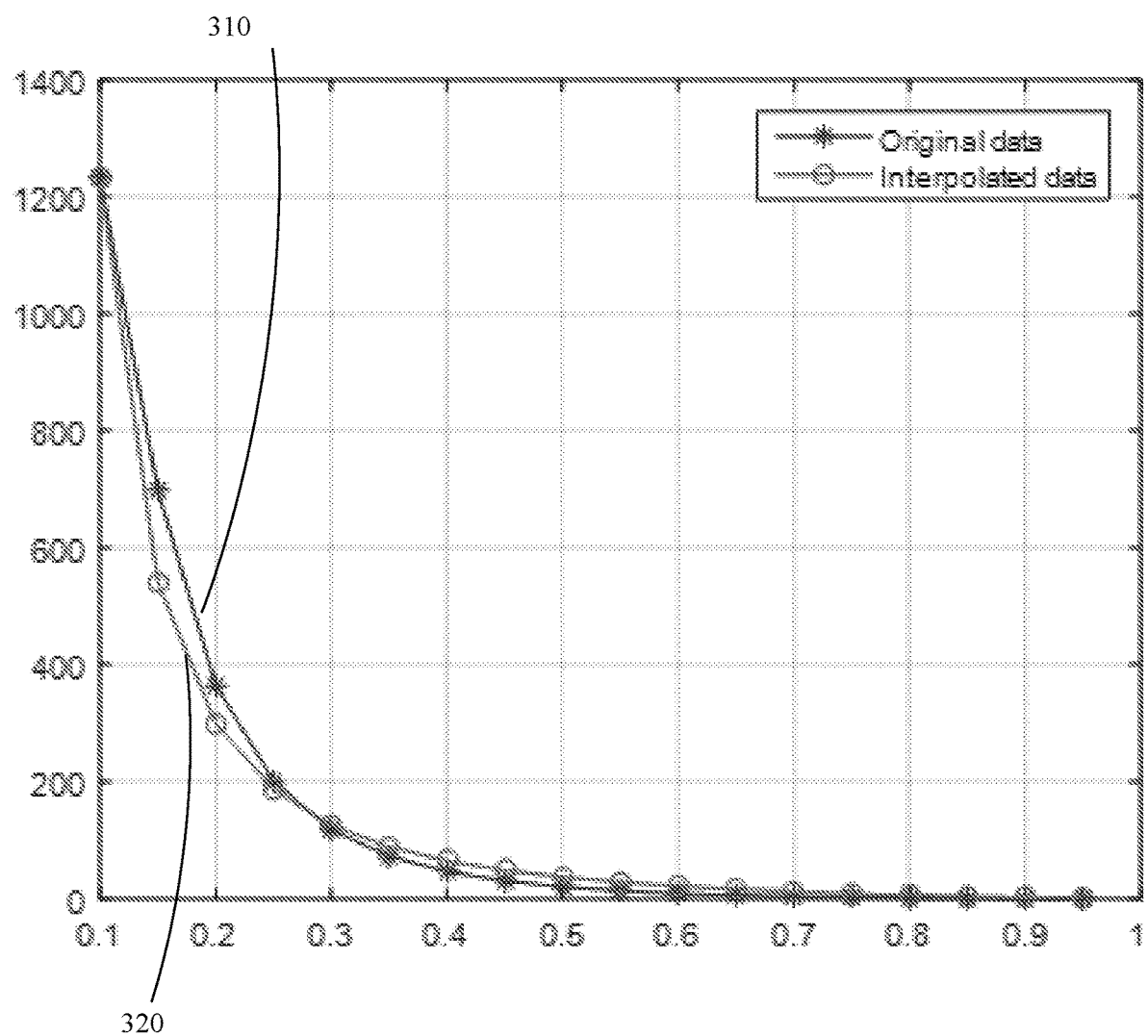
FIG. 3 is a plot showing examples of simulated real gradient numbers versus derived gradient numbers at different test distances, according to a representative embodiment.

FIG. 3 is a plot showing examples of simulated real gradient numbers versus derived gradient numbers at different test distances, according to a representative embodiment.

FIG. 3 shows an example of a simulation result in which the x axis denotes normalized test distance by far field test distance, and the y axis denotes EIRP gradient at different normalized test distances. In other words, in FIG. 3 a real gradient number is simulated versus a derived gradient number based on EIRP. In FIG. 3, the derived gradient numbers are based on an AUT (antenna under test) composed of multiple ideal isotropic antenna elements. The two middle field distances are at $\frac{1}{10}$ and $\frac{3}{20}$ of far field test distances in FIG. 3. In FIG. 3, the original data 310 is calculated according to Equation (1) above, and the interpolated data 320 is derived according to Equations (6), (7) and (8). FIG. 3 shows that even with only two simulated EIRP numbers at $\frac{1}{10}$ and $\frac{3}{20}$ of far field distances, the EIRP at arbitrary distances in the far field can be projected accurately from the $\frac{3}{20}$ distance with a tolerable estimation error.

In FIG. 3, the original data 310 and the interpolated data 320 are generally close together. The original data 310 is higher than or equal to the interpolated data 320 generally through about 0.25 on the X axis, and lower than or equal to the interpolated data 320 generally after about 0.25 on the X axis. In FIG. 3, the derived curve largely aligns with the real curve except for the absolute number for nulling areas at the lowest local areas on the plot.

Figure 4:
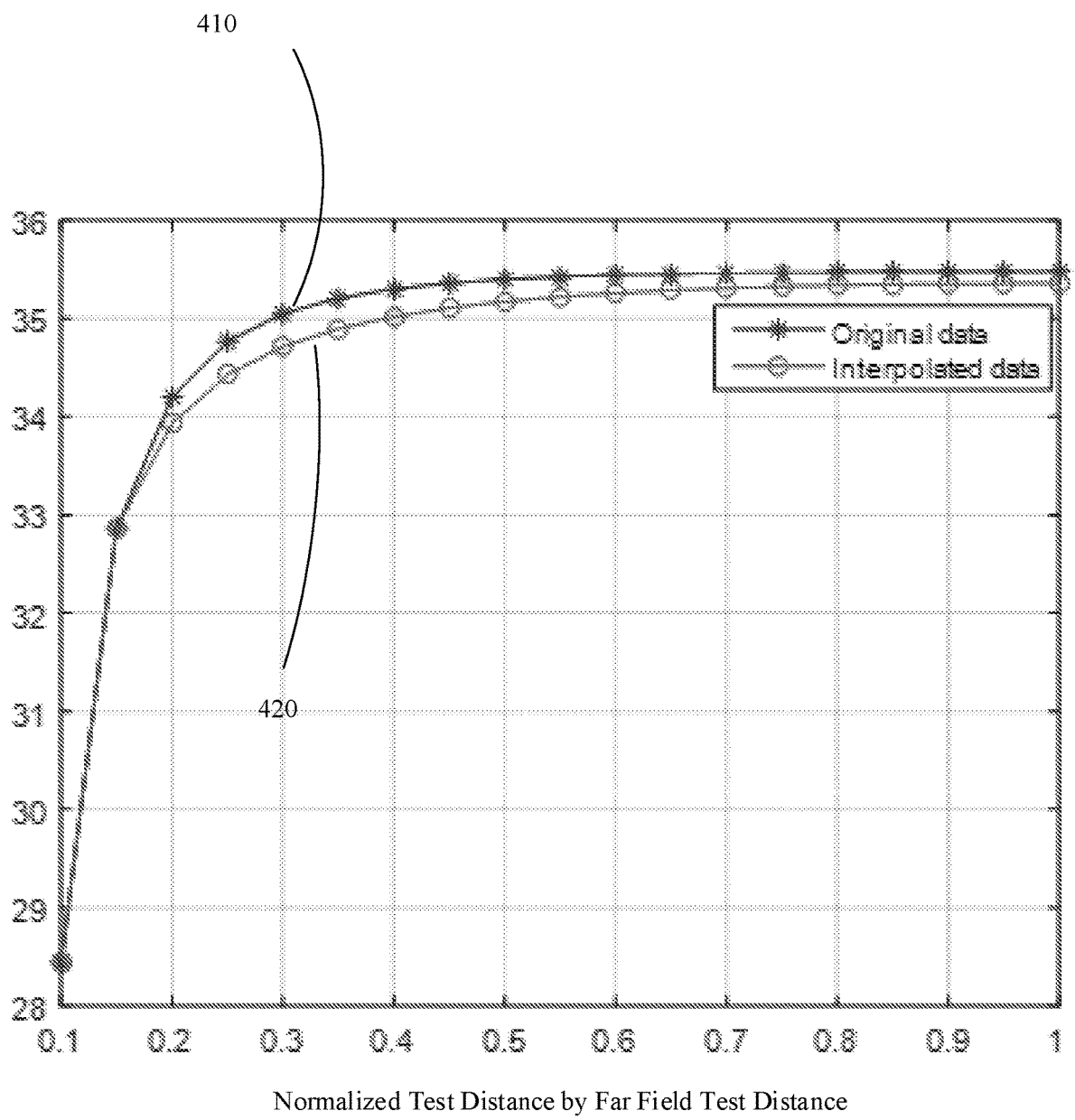
FIG. 4 is a plot showing examples of simulated real radiated power versus derived radiated power at different test distances, according to a representative embodiment.

FIG. 4 is a plot showing examples of simulated real radiated power versus derived radiated power at different test distances, according to a representative embodiment.

FIG. 4 shows another example of a simulation result in which the x axis denotes normalized test distance by far field test distance, and the y axis denotes EIRP in dBm (decibel milliwatts) at different normalized test distances. In other words, in FIG. 4 a real EIRP is simulated versus a derived EIRP based on EIRP numbers. The two middle field distances are again at $\frac{1}{10}$ and $\frac{3}{20}$ of far field test distances in FIG. 4.

In FIG. 4, the original data 410 and the interpolated data 420 are generally close together. The original data 410 is approximately equal to the interpolated data 420 generally through about 0.15 on the X axis, and primarily higher than the interpolated data 420 generally after about 0.25 on the X axis. In FIG. 4, the derived curve again largely aligns with the real curve except for the absolute number for nulling areas at the lowest local areas on the plot. That is, the original data 410 is calculated according to Equation (1) above, and the interpolated data 420 is derived according to Equations (6), (7) and (8). FIG. 4 confirms again that even with only two simulated EIRP numbers at $\frac{1}{10}$ and $\frac{3}{20}$ of far field distances, the EIRP at arbitrary distances in the far field can be projected accurately from the $\frac{3}{20}$ distance with a tolerable estimation error.

FIG. 5 is a plot showing examples of a simulated far field antenna pattern versus a derived far field antenna pattern based on simulated patterns at different test distances for a beamforming direction equal to 90 degrees, according to a representative embodiment.

FIG. 5 shows an example of a simulation result in which the x axis denotes rotation angle in degrees, and the y axis denotes EIRP in dBm (decibel milliwatts) in different directions. The main beam in FIG. 5 is centered at 90 degrees with a width of 20 between 80 degrees and 100 degrees. The plot in FIG. 5 is the result of a simulated far field antenna pattern versus a derived far field antenna pattern based on simulated patterns on $\frac{1}{10}$ and $\frac{3}{20}$ of far field test distances.

In FIG. 5, four curves are labelled though two of the four curves largely overlap. As should be expected, the middle field plots are offset from the far field plot(s) in most of FIG. 5. The plot 530 represents the middle field at $\frac{1}{10}$ of the far field. The plot 520 represents the middle field at $\frac{3}{20}$ of the far field. The plot 540 represents the original far field and is shown to closely overlap (at least visually) the plot 510 of the translation from the middle field. The original far field diverges from the translation of the middle field primarily at the lower portions of they axis.

FIG. 6 is a plot showing examples of a simulated far field antenna pattern versus a derived far field antenna pattern based on simulated patterns at different test distances for a beamforming direction equal to 120 degrees, according to a representative embodiment.

FIG. 6 shows an example of a simulation result in which the x axis denotes rotation angle in degrees, and the y axis denotes EIRP in dBm (decibel milliwatts) in different directions. The main beam in FIG. 6 is centered at 120 degrees with a width of approximately 20 between 110 degrees and 130 degrees. The plot in FIG. 6 is again the result of a simulated far field antenna pattern versus a derived far field antenna pattern based on simulated patterns on $\frac{1}{10}$ and $\frac{3}{20}$ of far field test distances.

In FIG. 6, four curves are labelled though again two of the four curves largely overlap. As is expected, the middle field plots are offset from the far field plot(s) in most of FIG. 6. The plot 630 represents the middle field at $\frac{1}{10}$ of the far field. The plot 620 represents the middle field at $\frac{3}{20}$ of the far field. The plot 640 represents the original far field and is shown to closely overlap (at least visually) the plot 610 of the translation from the middle field. The original far field diverges from the translation of the middle field primarily at the lower portions of the y axis.

Field testing has revealed results consistent with those shown in FIGS. 5 and 6. For example, a real measured antenna pattern on 50 cm versus a derived antenna pattern on 50 cm shows a close correspondence similar to that between plot 610 and plot 640 in FIG. 6 and plot 510 and plot 540 in FIG. 5. The field testing resulting in this correspondence used measured patterns at 30 cm and 40 cm for a beamforming direction of 90 degrees.

Variations in the antenna pattern shapes of the antenna array may occur as a function of increasing test distances. As the distance increases, the measured power decreases. In Equation (1), by setting the test distance $r_x$ of the probe antenna 110 to larger than the far field requirement, the antenna pattern for the main beam or a side beam of the antenna array (beam pattern) in the far field can be derived. The analysis described above provides for a projection from the middle field measurements to obtain the corresponding far field results without having to perform actual measurements in the far field of the antenna array 165.

Additionally, as noted previously the discussion herein mainly focuses on the measurement of transmitted two-dimensional (2D) and/or three-dimensional (3D) antenna patterns radiated from an antenna array such as antenna array 165 in FIG. 1. However, the teachings herein are equally applicable to measurements of a receiver antenna pattern so long as the receiver antenna pattern is maintained unchanged during the test. For conventional DUTs with radio frequency connectors, the power measurement of received power can be made at the RF connector. In integrated DUTs without radio frequency connectors, the DUT itself may report received power for the power measurement and this device reported receive power can be used for the power measurement.

The various components, structures, parameters and methods are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A method for testing an antenna array of a device under test (DUT) using a probe antenna for at least one of transmitting radio frequency (RF) signals to the antenna array or receiving radio frequency signals from the antenna array, the antenna array comprising a plurality of antenna elements, the method comprising:

measuring, as a first measurement using the probe antenna, an RF signal antenna pattern of the antenna array at a first position relative to the antenna array, the first position being located at a first distance from the antenna array in a middle field of the antenna array, wherein the middle field satisfies near field criteria for the antenna array and also satisfies far field criteria for each antenna element of the plurality of antenna elements in the antenna array;

measuring, as a second measurement using the probe antenna, the RF signal antenna pattern of the antenna array at a second position relative to the antenna array, the second position being located at a second distance from the antenna array in the middle field of the antenna array; and determining, based on the first measurement at the first position in the middle field and based on the second measurement at the second position in the middle field, the RF signal antenna pattern at a third position relative to the antenna array located in a far field of the antenna array.

2. The method of claim 1, wherein the determining of the RF signal antenna pattern at the third position in the far field comprises:

deriving a function of change in radiated power of the antenna array relative to change in distance from the antenna array in a single direction that includes the first position relative to the antenna array and the second position relative to the antenna array, based on the first measurement at the first position in the middle field and based on the second measurement at the second position in the middle field; and applying the function of change to a difference in distance between the second position and the third position, to obtain radiated power of the antenna array at the third position in the far field.

3. The method of claim 2, wherein the deriving of the function of change in radiated power of the antenna array relative to change in distance from the antenna array in a single direction comprises:

calculating a difference between the first measurement at the first position in the middle field and the second measurement at the second position in the middle field; and determining, from the difference, the function of change as a determined function of change, and wherein the determining of the RF signal antenna pattern at the third position comprises translating the first measurement at the first position and the second measurement at the second position in the middle field to the RF signal antenna pattern of the antenna array at the third position in the far field based on the determined function of change.

4. The method of claim 2, wherein the deriving of the function of change in radiated power of the antenna array relative to change in distance from the antenna array in a single direction comprises:

calculating a difference between the first measurement at the first position in the middle field and the second measurement at the second position in the middle field; and estimating, from the difference, the function of change as an estimated function of change by approximating that a distance between a center of the antenna array and the probe antenna is equal to a distance between each antenna element of the antenna array and the probe antenna, and wherein the determining of the RF signal antenna pattern at the third position comprises translating the first measurement at the first position and the second measurement at the second position in the middle field to the RF signal antenna pattern of the antenna array at the third position in the far field based on the estimated function of change.

5. The method of claim 2, wherein the deriving of the function of change in radiated power of the antenna array relative to change in distance from the antenna array in a single direction comprises:

calculating a difference between radiated power measured at the first position in the middle field and radiated power measured at the second position in the middle field; and estimating, from the difference, the function of change as an estimated function of change, independent of knowledge of beamforming coefficients of the antenna array, azimuth angles of antenna elements of the antenna array, and elevation angles of the antenna elements of the antenna array, and wherein the determining of the RF signal antenna pattern at the third position comprises projecting the first measurement at the first position in the middle field and the second measurement at the second position in the middle field to the RF signal antenna pattern of the antenna array at the third position in the far field based on the estimated function of change.

6. The method of claim 2, wherein the RF signal antenna pattern at the third position is determined by:

calculating a difference between the first measurement at the first position in the middle field and the second measurement at the second position in the middle field;

determining, from the difference, a relationship between change in power of the RF signal antenna pattern at the first position to power of the RF signal antenna pattern at the second position, and a change in distance from the antenna array between the first position and the second position; and simulating, based on the relationship, a far field antenna pattern of the antenna array using software simulation to determine the RF signal antenna pattern at the third position.

7. The method of claim 1, wherein the RF signal antenna pattern at the third position is determined independent of knowledge of beamforming coefficients used to generate the RF signal antenna pattern.

8. The method of claim 1, wherein measuring the RF signal antenna pattern of the antenna array at the first position comprises measuring radiated power of the antenna array at the first position, and measuring the RF signal antenna pattern of the antenna array at the second position comprises measuring radiated power of the antenna array at the second position.

9. A test system for testing an antenna array of a device under test (DUT), the antenna array comprising a plurality of antenna elements, the test system comprising:

a probe antenna positioned in a middle field of the antenna array, wherein the middle field includes a distance between the probe antenna and the antenna array that satisfies near field criteria for the antenna array and also satisfies far field criteria for each antenna element of the plurality of antenna elements in the antenna array;

at least one component configured to at least one of transmit radio frequency (RF) signals to the device under test or receive radio frequency (RF) signals transmitted from the device under test via the antenna array;

a memory device that stores instructions that, when executed, determine an antenna pattern located in a far field of the antenna array and a processor programmed to:

measure, as a first measurement using the probe antenna, an antenna pattern of the antenna array at a first position relative to the antenna array, the first position being located at a first distance from the antenna array in the middle field of the antenna array;

measure, as a second measurement using the probe antenna, the antenna pattern of the antenna array at a second position relative to the antenna array, the second position being located at a second distance from the antenna array in the middle field of the antenna array; and determine, based on the first measurement at the first position in the middle field and based on the second measurement at the second position in the middle field, the antenna pattern at a third position relative to the antenna array located in the far field.

10. The test system of claim 9, further comprising:

an anechoic test chamber configured to contain the probe antenna and the device under test, wherein a length of the anechoic test chamber is less than the far field.

* * * * *